(12) United States Patent
Hamasaki et al.

(10) Patent No.: US 7,667,982 B2
(45) Date of Patent: Feb. 23, 2010

(54) LSI PACKAGE WITH INTERFACE MODULE AND INTERFACE MODULE

(75) Inventors: Hiroshi Hamasaki, Hiratsuka (JP); Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 12/187,853

(22) Filed: Aug. 7, 2008

(65) Prior Publication Data

US 2009/0040739 A1 Feb. 12, 2009

(30) Foreign Application Priority Data

Aug. 10, 2007 (JP) ............... 2007-209526

(51) Int. Cl.
*H05K 1/11* (2006.01)
*H05K 1/14* (2006.01)

(52) U.S. Cl. .................. 361/803; 361/772; 361/774

(58) Field of Classification Search ......... 361/770–777, 361/803; 439/66, 68; 257/720–730; 174/259–268
See application file for complete search history.

(56) References Cited

U.S. PATENT DOCUMENTS

| | | | |
|---|---|---|---|
| 5,953,214 A * | 9/1999 | Dranchak et al. ........ 361/767 |
| 6,699,046 B2 * | 3/2004 | Ho et al. .................... 439/70 |
| 6,906,407 B2 * | 6/2005 | Byers et al. ............... 257/686 |
| 6,937,824 B2 | 8/2005 | Watanabe | |
| 7,394,665 B2 * | 7/2008 | Hamasaki et al. ......... 361/803 |

2006/0038287 A1 2/2006 Hamasaki et al.

FOREIGN PATENT DOCUMENTS

JP 2004-253456 9/2004

OTHER PUBLICATIONS

Hiroshi Hamasaki, et al., "Novel Optoelectronic LSI Packaging Suitable for Standard FR-4 Printed Wiring Board with Bandwidth Capability of Over 1Tbps", 2006 Electronic Components and Technology Conference, 2006, pp. 298-302.
Hiroshi Hamasaki, et al., "An Ultra High Performance 1 Tbps bandwidth Optoelectronic LSI Package using Post-reflow optical-interface Stacking Technique", 2007 Proceedings, IMAPS 4th International Symposium on Microelectronics, Nov. 2007, 8 Pages.

* cited by examiner

*Primary Examiner*—Tuan T Dinh
(74) *Attorney, Agent, or Firm*—Oblon, Spivak, McClelland, Maier & Neustadt, L.L.P.

(57) ABSTRACT

An LSI package includes an interface module having first and second surfaces and including a wiring board having a first through hole, a driver selectively provided on the second surface, a transmission line connected to the driver, and a first terminal formed on the second surface and connected to the driver, an interposer having a third surface facing the second surface and a fourth surface, and including a signal processor and a second terminal provided on the third surface, a third terminal provided on the fourth surface and a second through hole, the third surface facing the second surface except a region where the driver portion is provided. The interposer is arranged so that the first through hole matches with the second through hole, and a movable guide pin is inserted into the first and second through holes to position the interface module and the interposer.

19 Claims, 8 Drawing Sheets

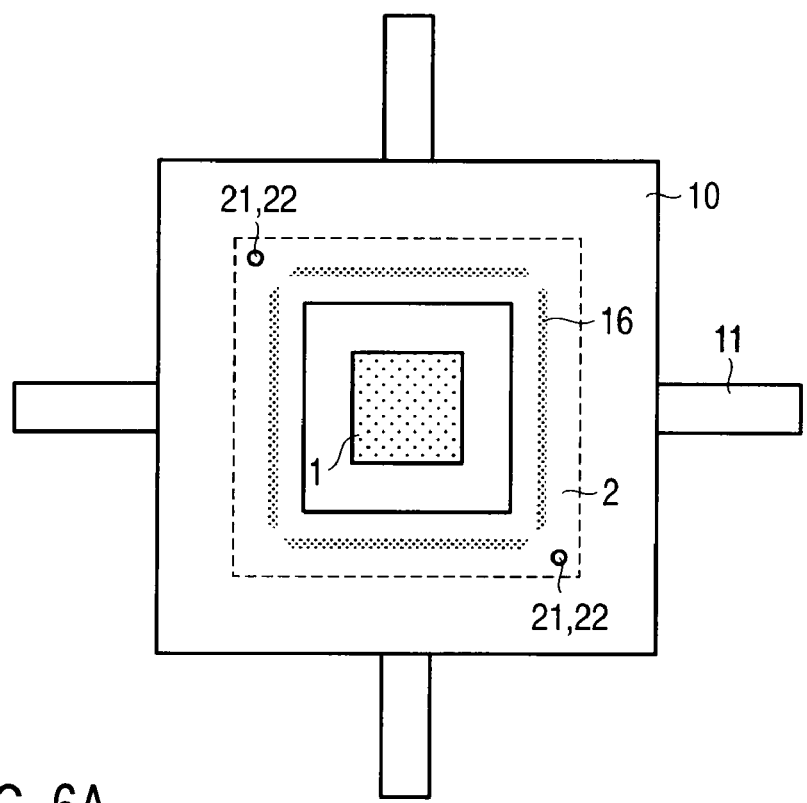
F I G. 6A
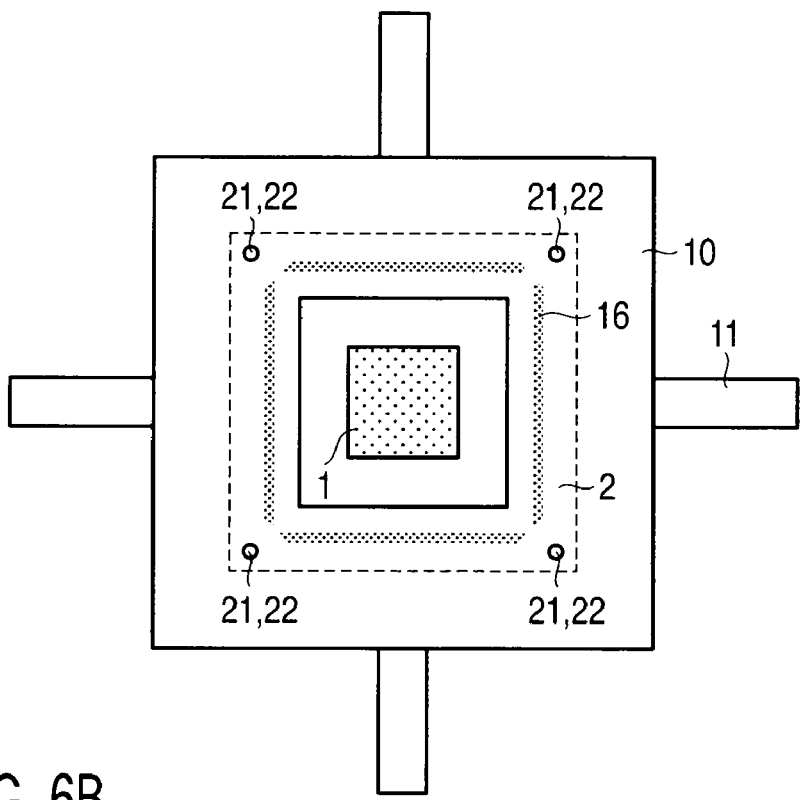
F I G. 6B

LSI PACKAGE WITH INTERFACE MODULE AND INTERFACE MODULE

CROSS-REFERENCE TO RELATED APPLICATIONS

This application is based upon and claims the benefit of priority from prior Japanese Patent Application No. 2007-209526, filed Aug. 10, 2007, the entire contents of which are incorporated herein by reference.

BACKGROUND OF THE INVENTION

In recent years, it has been demanded that the throughput of an interface connecting LSIs to each other be improved, as an LSI clock frequency increases. To improve the throughput of the interface, the rise of the signal frequency per terminal and the increase of the number of terminals are necessary. However, when the number of the terminals is increased, the area of wiring lines occupied in an LSI package increases, and a wiring length required for the connection tends to increase. On the other hand, when the signal frequency per terminal is raised, the attenuation of an electrical signal per unit length increases, and hence a line length is limited. Therefore, even for a high-speed signal having a high frequency, there is required a contrivance such as the employment of a transmission line or the like in which the attenuation is minimized.

It is effective to use an optical transmission line as a transmission line which scarcely affects the signal attenuation dependent on the signal frequency. For example, when an optical fiber is used, the signal attenuation due to the transmission through the fiber having a length of about several ten meters can substantially be ignored. When such an optical transmission line is used, it is advantageous to perform electrical/optical signal conversion at a position very close to the LSI. Therefore, there has been investigated a structure in which an optical interface module having a photoelectric conversion function is arranged very close to the LSI package.

Above all, an LSI package has been proposed in which an interposer (a rewiring substrate) including a signal processing LSI mounted thereon is assembled on a printed wiring board (PWB) by use of a usual mounting step, and then the optical interface module is mounted on the interposer without performing any thermal step later on, whereby the interface module is not thermally influenced (e.g., Jpn. Pat. Appln. KOKAI Publication No. 2004-253456).

However, in the structure disclosed in the above document, there may be a problem that the positioning of the interface module and the interposer is difficult. For this kind of positioning, there is a method in which reference holes and guide pins are used, but in this method, the guide pins need to be inserted into the plurality of reference holes, respectively. Therefore, clearances are required between the reference holes and the guide pins. This reason is that if the diameter of each guide pin is not smaller than that of the reference hole, the guide pins cannot be inserted into the reference holes, even when a slight deviation (pitch deviation) is produced between the reference holes or between the guide pins. Moreover, the clearances include the pitch deviations and the fluctuations or errors of the hole and pin diameters, and hence they become causes to disturb the highly precise positioning. In consequence, there may be a problem that restrictions are placed on a narrow pitch constitution using a large number of pins for the electrical connection between the interface module and the interposer.

BRIEF SUMMARY OF THE INVENTION

According to a first aspect of the invention, there is provided an LSI package with an interface module, which includes an interface module having a first surface and a second surface and including a wiring board having a first through hole, a driving element unit selectively provided on the second main surface, a transmission line connected to the driving element unit and configured to transmit and receive a signal, and a first electrical connection terminal formed on the second surface and electrically connected to the driving element unit, an interposer having a third surface facing the second surface and a fourth surface opposite to the third surface, and including a signal processing LSI mounted on the third surface, a second electrical connection terminal provided on the third surface, a mounting board connecting terminal provided on the fourth surface and a second through hole, the interposer being arranged so that the first through hole matches with the second through hole, and a movable guide pin inserted into the first through hole and the second through hole so that the first electrical connection terminal is connected to the second electrical connection terminal, to position the interface module and the interposer, wherein one of the first through hole and the second through hole is a first reference hole, the movable guide pin includes a cylinder portion to be fitted into the other of the first through hole and the second through hole and having a diameter larger than the first reference hole, and a tapered portion including one end to be matched with the cylinder portion and the other end having a diameter smaller than that of the first reference hole, the movable guide pin movable in a direction in which the interposer faces the interface module is provided in a preliminarily fixed state, and the tapered portion of the movable guide pin is pressed to an opening edge of the first reference hole to determine relative positions of the interface module and the interposer in an in-plane direction.

According to a second aspect of the invention, there is provided an interface module on which a signal processing LSI is mounted and which is to be mounted on an interposer having a plurality of reference holes for positioning, which include a wiring board, a driving element unit provided on a surface of the wiring board which faces the interface module, a transmission line which transmits and receives a signal to and from the driving element unit, an electrical connection terminal formed on the surface and electrically connected to the driving element unit, and a plurality of movable guide pins each having a cylinder portion and a tapered portion connected to the cylinder portion, the diameter of the cylinder portion being larger than a reference hole provided in the interposer, a diameter of an end portion of the tapered portion which faces the interposer being smaller than that of the reference hole, the plurality of movable guide pins being movable in a direction in which the movable guide pins face the interposer and being provided on the wiring board in a preliminarily fixed state, wherein the tapered portions of the movable guide pins are pressed to opening edges of the reference holes of the interposer, whereby the relative position of the interface module is determined with respect to the interposer in the in-plane direction.

BRIEF DESCRIPTION OF THE SEVERAL VIEWS OF THE DRAWING

FIGS. 6A and 6B are plan views showing the arrangement examples of guide pins and reference holes in the first embodiment;

DETAILED DESCRIPTION OF THE INVENTION

According to the embodiments of the present invention described hereinafter, an interface module and an interposer can highly precisely be positioned, whereby a narrow pitch interconnection using a large number of pins for electrical connection can be achieved. Embodiments of the present invention will hereinafter be described with reference to the drawings.

First Embodiment

Figure 1A:
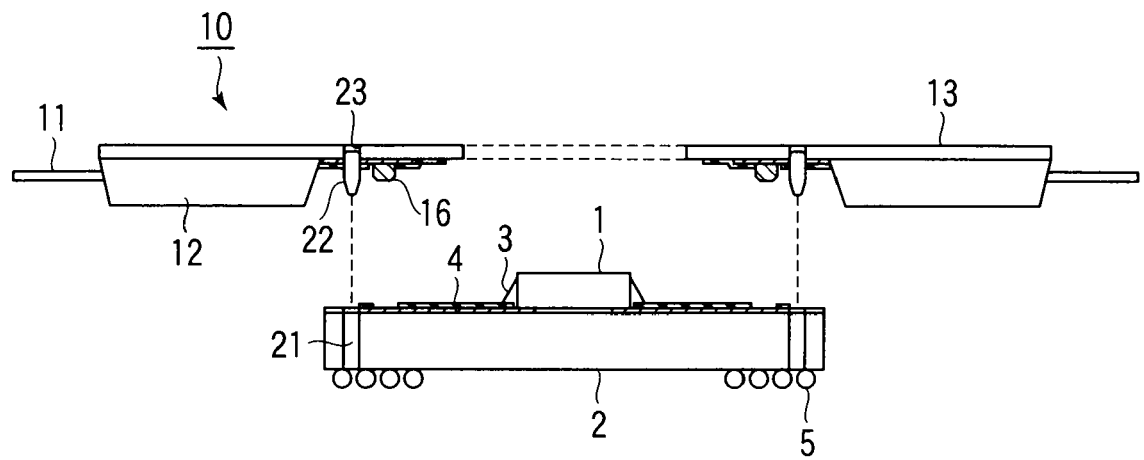
FIGS. 1A and 1B are sectional views showing the schematic constitution of an LSI package with an interface module according to a first embodiment.
Figure 1B:
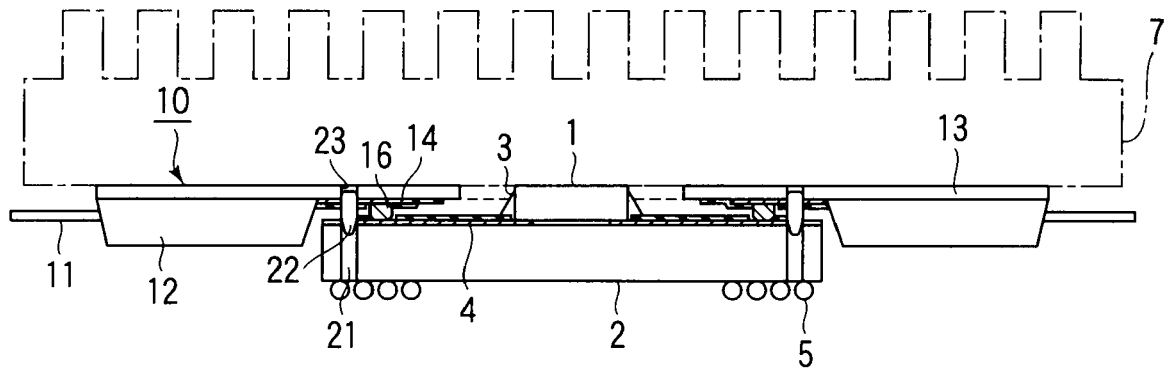
Figure 2:
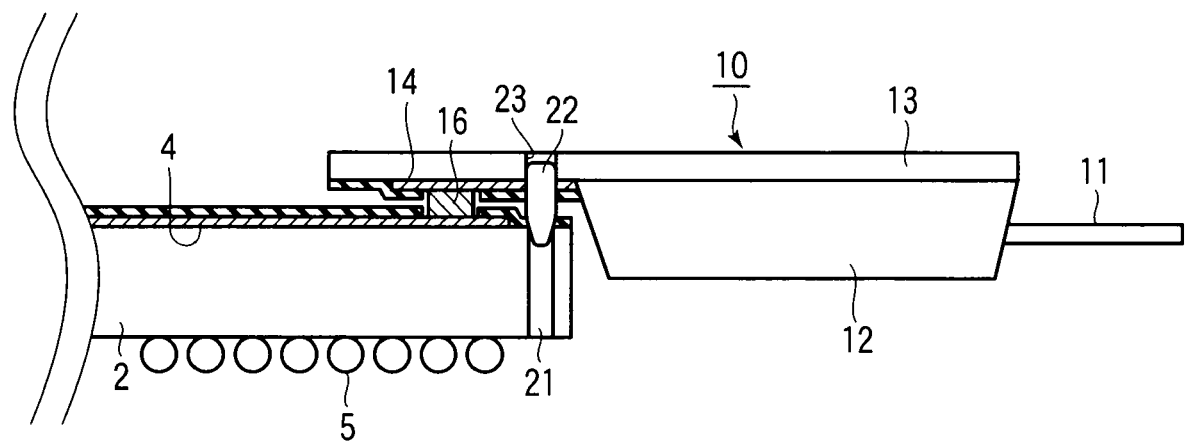
FIG. 2 is an enlarged sectional view showing the main part constitution of the LSI package with the interface module according to the first embodiment.

FIGS. 1A and 1B are sectional views showing the schematic constitution of an LSI package with an interface module according to a first embodiment. FIG. 1A shows a state before the interface module is connected, and FIG. 1B shows a state after the module is connected. FIG. 2 is an enlarged sectional view showing the main part constitution of the LSI package with the interface module in the state after the interface module is connected.

In the drawing, a signal processing LSI 1 is mounted on the surface of an interposer 2. More specifically, the LSI 1 is electrically connected to the interposer 2 via solder bumps (not shown), and solder bump connecting portions are sealed with an underfill resin 3.

The surface of the interposer 2 is provided with a high-speed signal wiring line 4, and a part of this wiring line 4 is connected to a signal input/output terminal of the LSI 1. Moreover, a part of the high-speed signal wiring line 4 forms a first electrical connection terminal to be connected to a second electrical connection terminal of the interface module described later.

The back surface of the interposer 2 is provided with mounting board connecting electrical terminals 5 formed of, for example, a ball grid array (BGA) or the like. The interposer 2 is mounted on a mounting board (not shown) by solder reflow using the electrical terminals 5. Then, a power voltage, a comparatively low-speed control signal and ground potential (GND) are supplied from the mounting board to the LSI 1 through the interposer 2.

In the drawing, an interface module 10 has a transmission line 11 for externally distributing a high-speed signal, and a driving element unit 12 which transmits the signal to the transmission line 11 or receives the signal from the transmission line 11.

The transmission line 11 is constituted of an optical fiber, an optical wave guide, or a fine coaxial line. In a case where the optical fiber is used as the transmission line 11, there are many advantages that transmission loss through the optical fiber having a length of several ten meters can substantially be ignored as compared with the fine coaxial line and that the diameter of the fiber can be decreased to realize miniaturization and that ground line can be separated for transmission and reception.

In the driving element unit 12, optical devices such as a light emitting device and a light receiving device and an interface IC are embedded. Moreover, a wiring line from the optical device to the interface IC is drawn internally (an LSI 1 side) from an inner wiring line 14, and is connected to a second electrical connection terminal 16. The electrical connection terminal 16 is electrically connected to a part (the first electrical connection terminal) of the wiring line 4 formed on the interposer 2.

An opening is provided in the center of the interface module 10. When the interface module 10 is mounted on the interposer 2, the signal processing LSI 1 is inserted into this opening so that the upper surface of the signal processing LSI 1 has a height substantially equal to that of the upper surface of the interface module 10. In consequence, the signal processing LSI 1 and the interface module 10 are cooled by a common heat sink 7.

The interposer 2 is provided with a circular positioning reference hole 21 extending in a substantially vertical direction with respect to the surface of the interposer 2. On the other hand, a guide pin 22 having a diameter larger than that of the reference hole 21 is pressed into a holding hole 23, and is thus preliminarily fixed (semi-fixed) to the interface module 10. The distal end of the guide pin 22 is tapered, and the pin is thinned toward the distal end thereof. The diameter of the distal end of the pin is smaller than that of the reference hole 21. The holding hole 23 has a diameter substantially equal to that of the main body (a cylinder portion) of the guide pin 22, and is extended through the surface of the interface module 10 in a substantially vertical direction. In consequence, the guide pin 22 is movable in a direction in which the interface module 10 faces the interposer 2.

It is to be noted that a part of the rear end of the guide pin 22 is pressed into the holding hole 23, and is preliminarily fixed (semi-fixed) so that the pin does not fall off. Moreover, when a predetermined or more force is applied to the distal end of the guide pin 22, the guide pin 22 moves backwards.

To mount the interface module 10 on the interposer 2, in a state in which the tapered portion of the guide pin 22 is pressed onto the opening edge of the reference hole 21, the interface module 10 and the interposer 2 are relatively positioned with respect to each other in a lateral direction. At this time, the electrical wiring line 14 of the interface module 10 needs to be securely electrically connected to the electrical wiring line 4 of the interposer 2 via the electrical connection terminal 16, so that a space (in the vertical direction in the drawing) between the interface module 10 and the interposer 2 needs to be adjusted into a predetermined height.

On the other hand, the position of the guide pin 22 in a height direction in which the pin comes in contact with the opening edge of the reference hole 21 depends on relative positional deviation, hole diameter or guide pin diameter, and hence does not become constant. Therefore, a height adjustment mechanism is required for setting the space to a predetermined value. This height adjustment mechanism is realized as follows. The mechanism will be described with reference to FIGS. 3A to 3D.

Figure 3A:
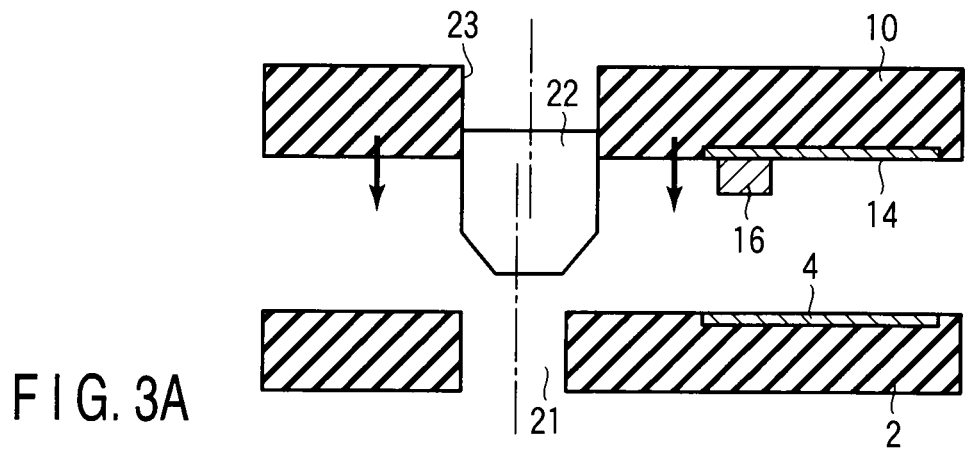
FIGS. 3A-3D are sectional views for explaining the principle of a height adjustment mechanism in the first embodiment.
Figure 3B:
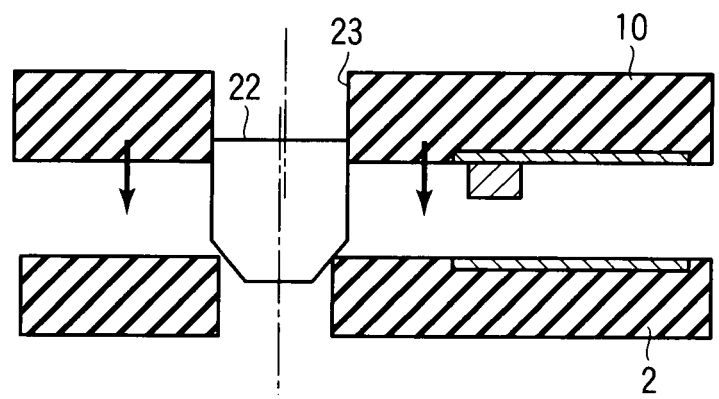

First, as shown in FIG. 3A, the interface module 10 is set from the upside so that the distal end of the guide pin 22 enters the reference hole 21 of the interposer 2. Then, as shown in FIG. 3B, when the tapered portion of the guide pin 22 is pressed onto the opening edge of the reference hole 21, the center positions of the guide pin 22 and the reference hole 21 are self-aligned and guided to substantially match with each other. At this time, the electrical connection terminal 16 is not connected to the electrical wiring line 4. Here, the guide pin 22 may be inserted into the holding hole 23 and fixed tentatively. Alternatively, the guide pin may be pressed into the holding hole 23 immediately before the interface module 10 is connected to the interposer 2.

Figure 3C:
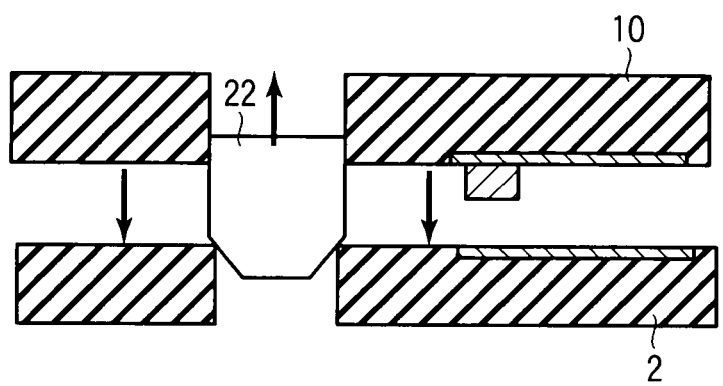
Figure 3D:
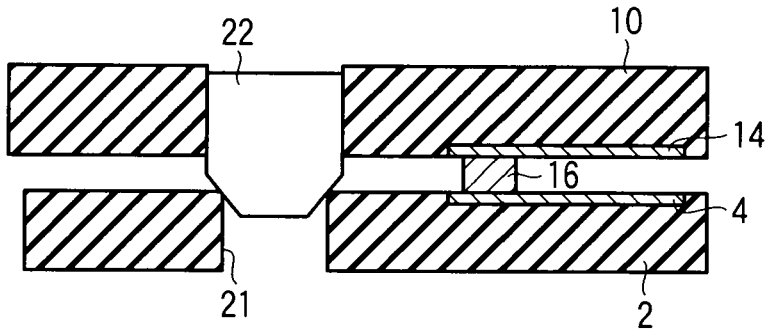

Subsequently, as shown in FIG. 3C, the interface module 10 is pressed to increase a load, whereby the preliminarily fixed (semi-fixed) guide pin 22 starts sliding upwards in the holding hole 23. Then, as shown in FIG. 3D, while holding the relative positions of the interface module 10 and the interposer 2 in the in-plane direction, the space between the interface module 10 and the interposer 2 is narrowed. Finally, when the electrical connection terminal 16 comes in contact with the electrical wiring line 4, the load is scattered over a plurality of electrical connection terminals 16 to stop the sliding of the guide pin 22, whereby the positioning and the electrical connection are completed.

Here, the guide pin 22 is provided with the tapered portion, and this tapered portion is brought into the opening edge of the reference hole 21. Therefore, even if there are variations in the pin diameter and hole diameter, the center of the guide pin 22 finally substantially matches with the center of the reference hole 21. Therefore, the package is not influenced by the variations of the pin diameter and hole diameter.

A mechanism for the positioning by use of a pair of guide pin 22 and reference hole 21 has been described above. However, when the pair of guide pin and reference hole are used, deviation is produced owing to the direction of rotation around the axis of the guide pin 22 as a rotary shaft. Therefore, in a usual pattern which is not uniform in the direction of rotation, for example, a concentric circle pattern, the positioning cannot be performed. Therefore, two or more pairs of pins and holes are at minimum are necessary. A case where two pairs of pins and holes are used will further be described with reference to FIGS. 4A and 4B and FIGS. 5A to 5D.

Figure 4A:
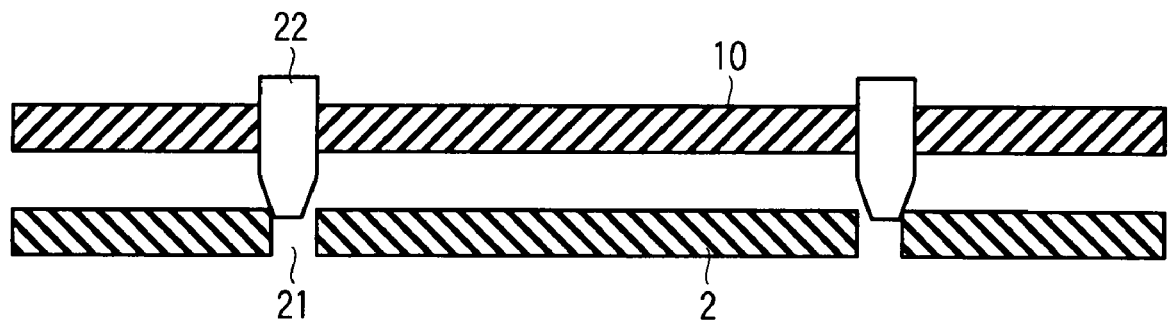
FIGS. 4A and 4B are sectional views for explaining a mechanism capable of positioning in an in-plane direction according to the first embodiment.
Figure 4B:
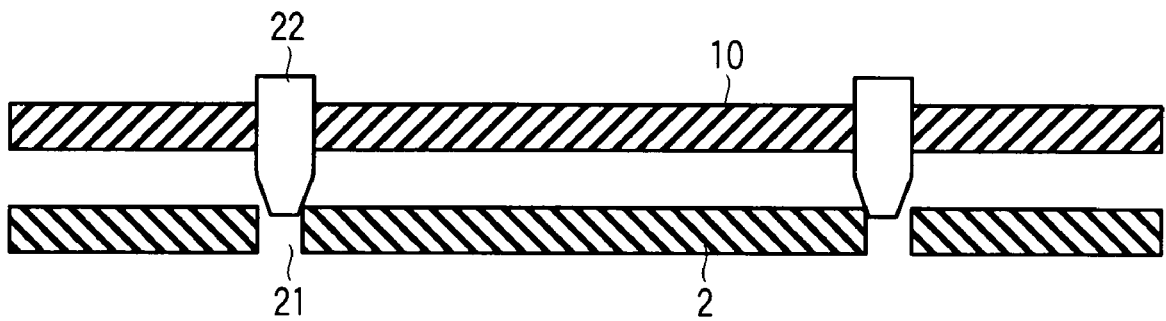

When a plurality of positioning pins are used, the pitch between the guide pins 22 usually does not match with that between the reference holes 21. Therefore, as shown in FIGS. 4A and 4B, one of the pitches becomes large. FIG. 4A shows a case where the pitch between the guide pins 22 is larger, and FIG. 4B shows a case where the pitch between the reference holes 21 is larger. As seen from FIGS. 4A and 4B, in either case, the interface module is guided so that the center positions of the two guide pins 22 substantially match with those of the reference holes 21. Therefore, the positions of the electrodes of the interposer 2 and interface module 10 are determined based on the center positions, whereby the influences of positional deviations due to the pitch deviations of the guide pins 22 and reference holes 21 can be eliminated.

Figure 5A:
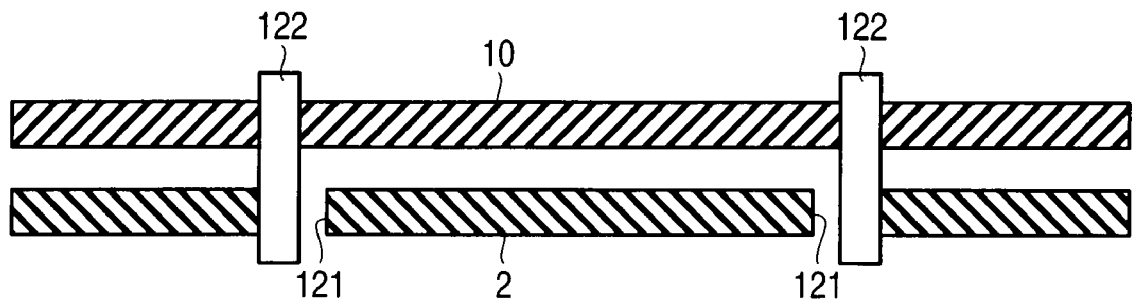
FIGS. 5A-5D are sectional views for explaining a comparative example.
Figure 5B:
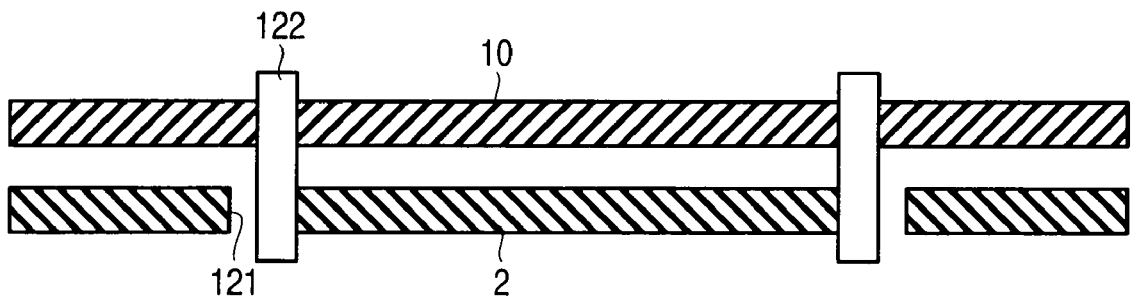
Figure 5C:
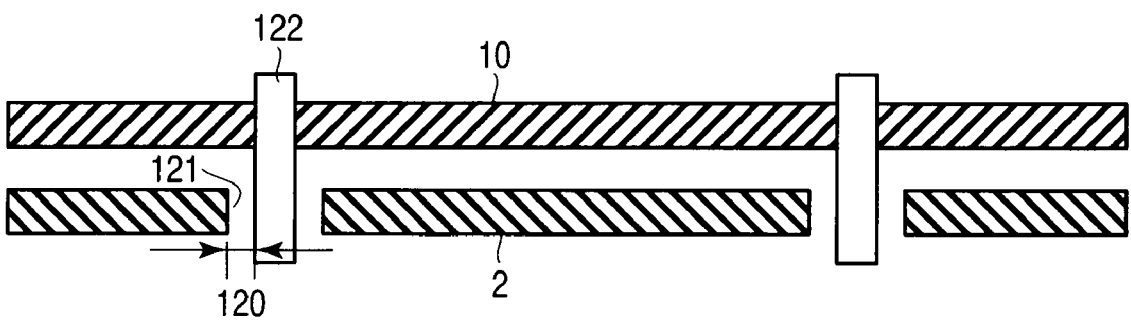
Figure 5D:
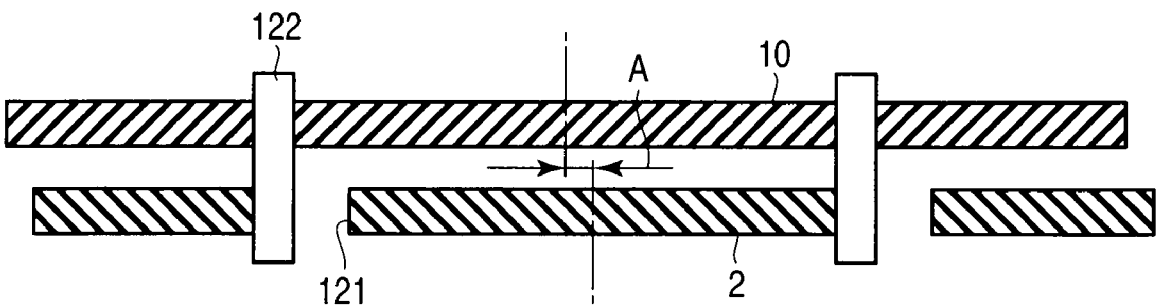

On the other hand, a method of inserting, into a reference hole 121, a guide pin 122 having a diameter smaller than that of the reference hole 121 as in a comparative example is shown in FIGS. 5A to 5D. In this case, when a pitch between the guide pins 122 is large as shown in FIG. 5A, or when a pitch between the reference holes 121 is large as shown in FIG. 5B, the guide pins 122 need to be inserted into the reference holes 121. Therefore, as shown in FIG. 5C, a clearance 120 between the guide pin 122 and the reference hole 121, corresponding to a maximum pitch deviation, is necessary. Then, as shown in FIG. 5D, a center position deviation A corresponding to the maximum pitch deviation is produced, and a positioning error is unnecessarily added, so that it becomes difficult to perform highly precise positioning.

Next, an arrangement relation between the guide pins 22 and the reference holes 21 will be described with reference to FIGS. 6A and 6B.

In FIG. 6A, the arrangement of the guide pins 22 and the reference holes 21 is set to the vicinity of the diagonal line of a substrate. In this case, the center position of the substrate substantially matches with the center positions between the guide pins 22 and between the reference holes 21, so that there are many advantages. For example, when the package is assembled with an automatic machine, the rotary center is advantageously substantially matched.

When two pairs of guide pins and reference holes are used, there remains a component rotating around a line connecting the two pairs to each other as an axis. Therefore, in consideration of a large possibility of eccentricity in a case where a load is applied, as shown in FIG. 6B, more than two pairs of guide pins 22 and reference holes 21 may be used. In this case, the clearances formed by the tapered portion may be large to such an extent that the tapered portions of the remaining guide pins 22 are pressed onto the reference holes 21 with respect to the relative position determined by two of the plurality of pairs. Moreover, the load can be supported by a plurality of guide pins. In consequence, there is an advantage that the balance of the load improves.

It is to be noted that when a pair of guide pin 22 and reference hole 21 are used, they deviate in the direction of rotation, and cannot be positioned, but a stop for regulating the deviation in the direction of rotation may be provided so that this deviation is eliminated. In this case, the central position cannot be defined, but only one point of an engagement portion can be matched. Therefore, in the interposer 2 and the interface module 10, a wiring line pattern or the like may be formed based on the reference hole 21 and the guide pin 22.

Figure 7:
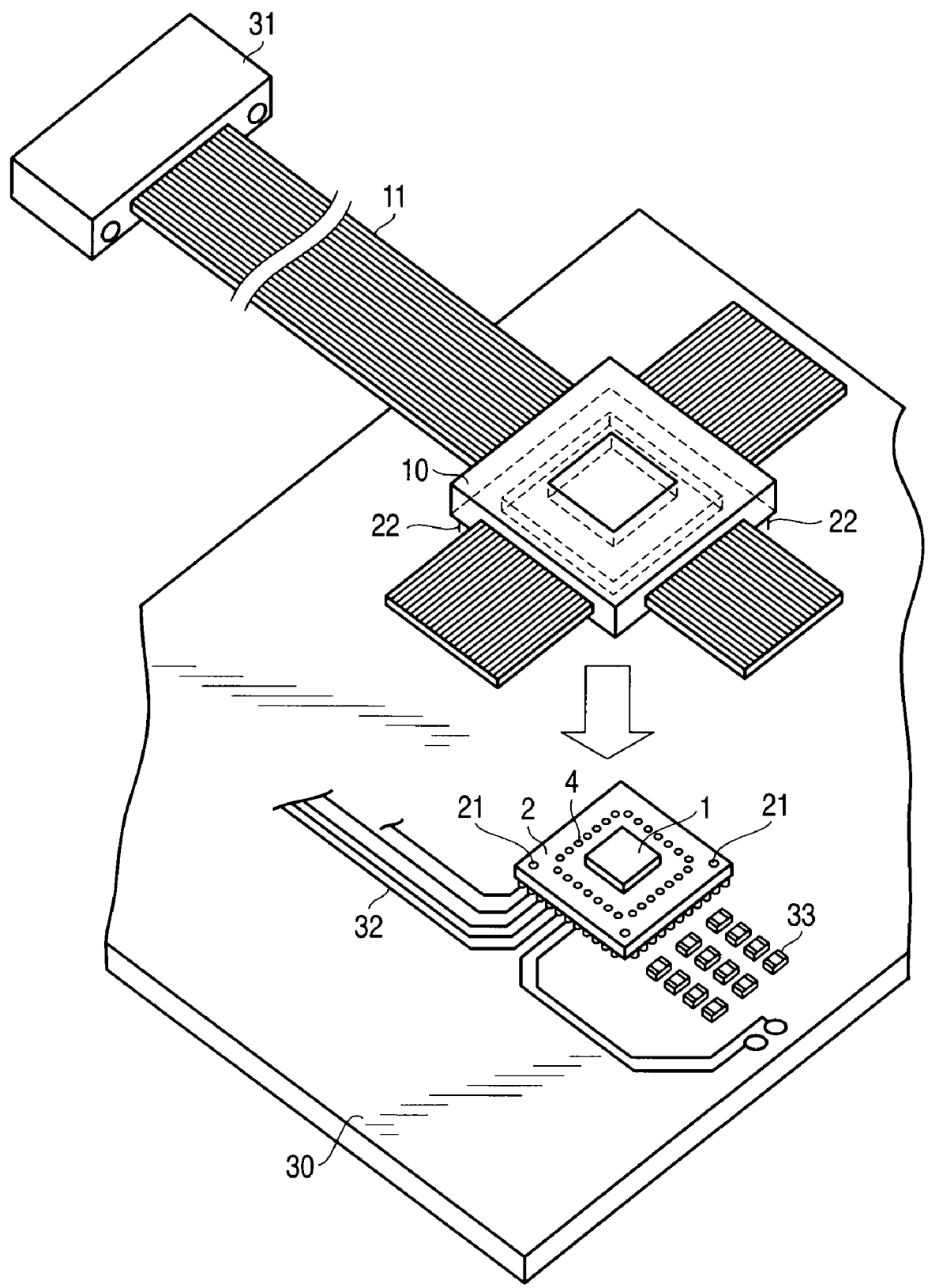
FIG. 7 is a perspective view showing the mounting way of the package in the first embodiment.
Figure 8A:
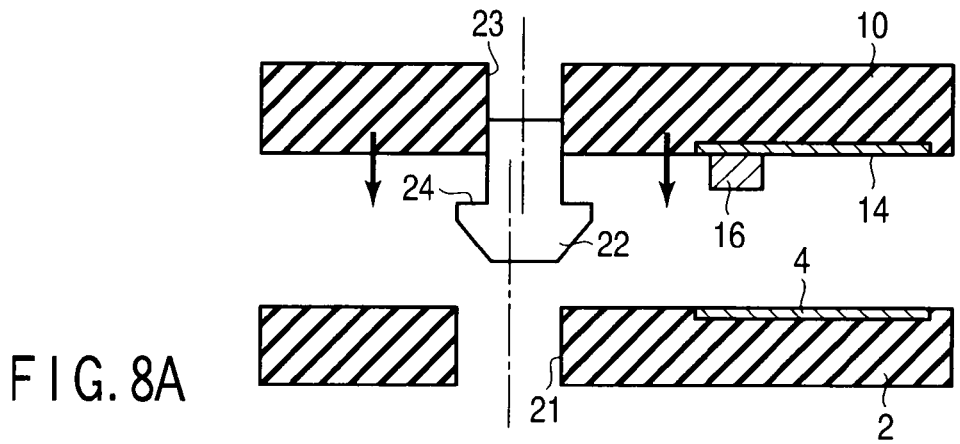
FIGS. 8A-8D are sectional views showing a part of an LSI package with an interface module according to a second embodiment.
Figure 8B:
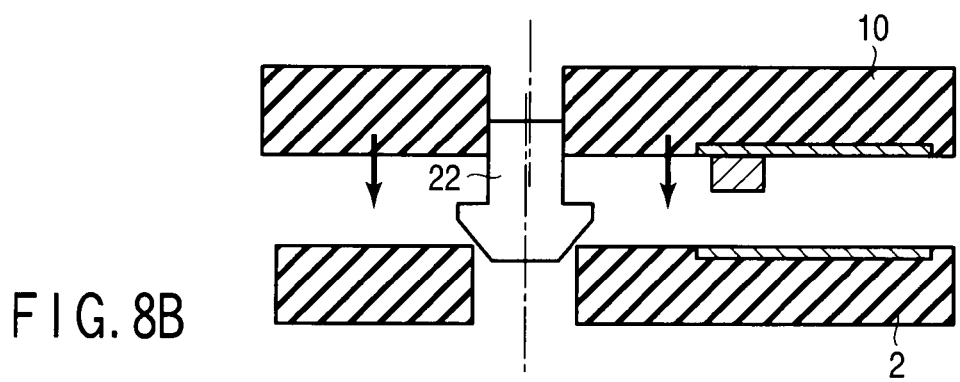
Figure 8C:
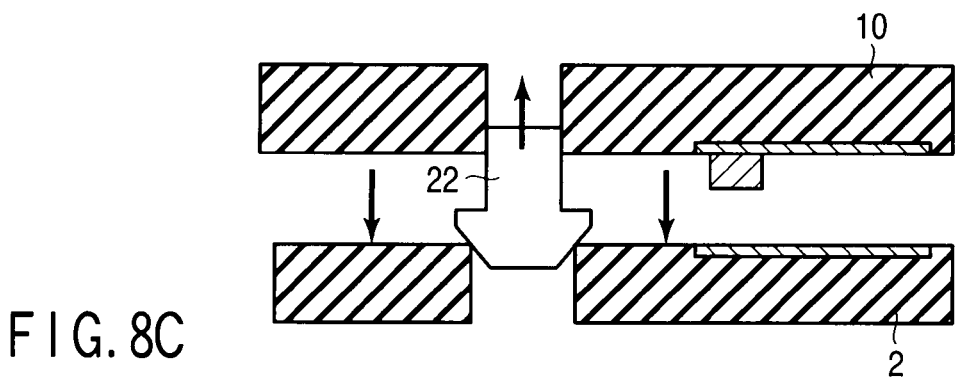
Figure 8D:
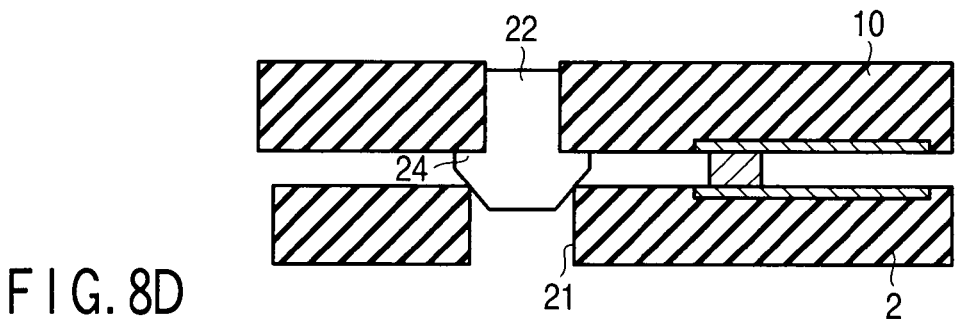

FIG. 7 is a perspective view showing the mounting state of the package provided with a high-speed interface module according to the present embodiment.

After the interposer 2 including the signal processing LSI 1 mounted thereon is mounted together with another mounting component on a mounting board 30, the interface module 10 is mounted on the interposer 2 as shown by an arrow in the drawing. At this time, the guide pins 22 of the interface module 10 are aligned with the reference holes 21 of the interposer 2, whereby the interface module 10 and the interposer are precisely positioned. It is to be noted that reference number 32 is a wiring line on the mounting board 30, and 33 is a chip component. Moreover, the ends of the transmission lines 11 including optical fibers opposite to the optical interface module 10 are connected to an optical connector 31 for connection to external optical fibers.

Thus, the optical connector 31 is connected to a place away from the optical interface module 10, whereby mounting restrictions imposed by the enlarged optical connector structure can be solved.

Moreover, after finishing electrical mounting by a method of soldering the interposer 2 on which the signal processing LSI 1 is mounted together with the other mounting components (e.g., chip components such as a capacitor and a reactance, peripheral LSI and IC, etc.) by a usual reflow step or fitting these components into sockets, the interface module 10 can be attached later only by mechanical connection without adding any thermal history to the module. Therefore, the transmission lines for use in the interface module 10 can be selected without being limited by any mounting step. Therefore, an appropriate material can be selected in accordance with a transmission distance, frequency or cost, and the whole cost can effectively be decreased.

As described above, according to the present embodiment, the interposer 2 is provided with the reference hole 21 for positioning, whereas the interface module 10 is provided with the preliminarily fixed (semi-fixed) guide pin 22 having a tapered thinned shape in which the diameter of a cylinder portion is larger than that of the reference hole 21 and the diameter of a distal end is smaller than that of the reference hole 21. In consequence, the interposer 2 and the interface module 10 can precisely be positioned in an in-plane direction in a state in which the tapered portion of the guide pin 22 is pressed onto the circumferential edge of the reference hole 21 on the surface of the substrate. In addition, the guide pin 22 is slid into the holding hole 23 so that a predetermined space is made between the interface module 10 and the interposer 2, whereby the space between the interface module 10 and the interposer 2 can be adjusted (height adjustment). Therefore, the pitch narrowing involving a large number of pins for electrical connection can be achieved, and the LSI package with the interface module capable of transmitting a large capacity can be realized.

Moreover, only the reference holes 21 may be formed in the interposer 2, so that the existing LSI package assembly step (e.g., the reflow step or the like) may be applied as it is. This also produces an advantage that line adjustment or reconstruction does not have to be performed.

Second Embodiment

FIGS. 8A to 8D are sectional views showing a part of an LSI package with an interface module according to a second embodiment of the present invention. It is to be noted that the same components as those of FIGS. 3A to 3D are denoted with the same reference numbers, and detailed description thereof is omitted. Moreover, the steps of FIGS. 8A to 8D correspond to those of FIGS. 3A to 3D, respectively.

The present embodiment is different from the first embodiment in that the middle portion of a guide pin 22 between the preliminarily fixed (semi-fixed) main body portion of the pin and the tapered portion thereof is provided with a stop portion 24 having a diameter which is discontinuously larger than that of the main body portion. That is, the distal end (the minimum diameter) of the tapered portion of the guide pin 22 is smaller than the diameter of a reference hole 21, and the proximal end (the maximum diameter) of the tapered portion is larger than the reference hole 21 and is also larger than a holding hole 23. In this case, the diameter of the main body of the guide pin 22 (the diameter of a portion to be inserted into the holding hole 23) does not have to be necessarily larger than the reference hole 21. As long as the minimum diameter of the tapered portion of the main body of the guide pin 22 is smaller than the reference hole 21 and the maximum diameter of the tapered portion is larger than the reference hole 21, the diameter of the main body of the guide pin 22 may be smaller than that of the reference hole 21.

According to such a constitution, the relative positions of an interposer 2 and an interface module 10 in an in-plane direction are determined, and then the guide pin 22 starts to slide in the holding hole 23, whereby electrical connection terminals come in contact with each other to achieve electrical connection. Here, if a large load is applied and the guide pin 22 further slides, the sliding is stopped in the stop portion 24, so that electrical connecting portions can be inhibited from being excessively collapsed. In consequence, even if eccentricity is produced in the load and a force larger than a designed force is eccentrically applied, the sliding is stopped in the stop portion 24, and the load is scattered to another guide pin 22. This produces an effect that the uniform electrical connection can be performed.

Third Embodiment

Figure 9:
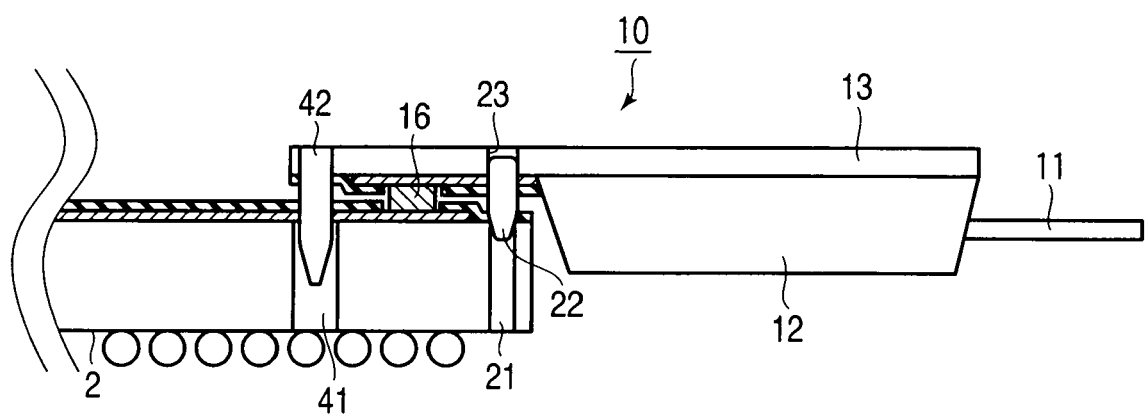
FIG. 9 is a sectional view showing the main part constitution of an LSI package with an interface module according to a third embodiment.

FIG. 9 is a sectional view showing a part of an LSI package with an interface module according to a third embodiment of the present invention. It is to be noted that the same components as those of FIG. 2 are denoted with the same reference numbers, and detailed description thereof is omitted.

In the present embodiment, an interposer 2 is provided with a coarse positioning second reference hole 41 separately from a first reference hole 21. This reference hole 41 is provided so that the hole extends from the front surface of the interposer 2 to the back surface thereof in a substantially vertical direction. The number of the reference holes 41 may be one or plural, but two or more second reference holes may preferably be required for securely performing coarse adjustment.

On the other hand, a second guide pin 42 to be inserted into the second reference hole 41 is fixed to an interface module 10. The diameter of this guide pin 42 is smaller than that of the reference hole 41. Furthermore, the length of the second guide pin 42 is larger than that of the first guide pin 22, so that the second guide pin 42 is inserted into the second reference hole 41 before the tapered portion of a first guide pin 22 comes in contact with the opening edge of a first reference hole 21.

According to such a constitution, the second guide pin 42 is inserted into the second reference hole 41, whereby the relative positions of the interface module 10 and the interposer 2 in an in-plane direction can be coarsely adjusted. In consequence, the positioning can be coarsely performed in advance with the second guide pin 42 and the second reference hole 41, whereby the distal end of the guide pin 22 can be prevented from being detached from the reference hole 21, and the positioning can quickly and securely be performed.

It is to be noted that even in the third embodiment, two or more pairs of first guide pins 22 and first reference holes are preferably provided. Moreover, the first guide pin 22 may be provided with a stop portion 24 as shown in FIGS. 8A to 8D. The upper surface of the interface module 10 may substantially be the same plane as the upper surface of the signal processing LSI (not shown) of the interposer, whereby a heat sink can preferably easily be mounted.

(Modification)

It is to be noted that the present invention is not limited to the above embodiments. In the first to third embodiments, a case where a movable guide pin is preliminarily fixed on the side of an interface module has been described. Conversely, the guide pin may preliminarily be fixed on the side of an interposer, and a reference hole may be provided on the side of an interface module. Moreover, a pair of guide pin and reference hole or a plurality of pairs of guide pins and reference holes may be provided. However, to exactly define a central position between the guide pins, two or more pairs are preferable.

Moreover, a technique for installing the guide pin in a preliminarily fixed state is not limited to a case where the diameter of the main body portion of the guide pin is set to a diameter equal to that of a holding hole to press the guide pin into the holding hole, thereby holding the pin. Alternatively, a mechanism for exclusive use in holding the guide pin in the preliminarily fixed state may be provided.

In the third embodiment, a stational guide pin is fixed on the side of the interface module, and the reference hole is provided on the side of the interposer, but this may be reversed. Moreover, a movable guide pin and the stational guide pin may be provided on the same side of the interface module or the interposer, or may be provided on both the sides so that the pins face each other.

Furthermore, the electrical connection terminals are not necessarily limited to bumps, and may have a structure in which stud bumps are formed, and crushed with an ultrasonic wave or the like so that they are bonded. In addition, to improve the reliability of a bonded portion, an underfill resin may be inserted thereto. Further, a cross section of a hole, pin, cylinder portion and so forth may not be a real circle.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An LSI package with an interface module comprising:
   an interface module having a first surface and a second surface and including a wiring board having a first through hole, a driving element unit selectively provided on the second main surface, a transmission line connected to the driving element unit and configured to transmit and receive a signal, and a first electrical connection terminal formed on the second surface and electrically connected to the driving element unit;
   an interposer having a third surface facing the second surface and a fourth surface opposite to the third surface, and including a signal processing LSI mounted on the third surface, a second electrical connection terminal provided on the third surface, a mounting board connecting terminal provided on the fourth surface and a second through hole, the interposer being arranged so that the first through hole matches with the second through hole; and
   a movable guide pin inserted into the first through hole and the second through hole so that the first electrical connection terminal is connected to the second electrical connection terminal, to position the interface module and the interposer,
   wherein one of the first through hole and the second through hole is a first reference hole,
   the movable guide pin includes a cylinder portion to be fitted into the other of the first through hole and the second through hole and having a diameter larger than the first reference hole, and a tapered portion including one end to be matched with the cylinder portion and the other end having a diameter smaller than that of the first reference hole, the movable guide pin movable in a direction in which the interposer faces the interface module is provided in a preliminarily fixed state, and
   the tapered portion of the movable guide pin is pressed to an opening edge of the first reference hole to determine relative positions of the interface module and the interposer in an in-plane direction.

2. The LSI package according to claim 1, wherein one of the interposer and the interface module is provided with a second reference hole, the other of the interposer and the interface module is provided with a stational guide pin having a diameter smaller than the second reference hole, and the stational guide pin is inserted into the second reference hole to coarsely adjust the relative positions of the interface module and the interposer in the in-plane direction.

3. The LSI package according to claim 1, further comprising at least two or more pairs of the movable guide pin and the at least two or more pairs of the first reference hole.

4. The LSI package according to claim 1, wherein the movable guide pin has a stop portion having a diameter discontinuously enlarged between the cylinder portion and the tapered portion.

5. The LSI package according to claim 1, wherein the interface module includes an opening having a size larger than the signal processing LSI in a position facing the signal processing LSI, and the first surface of the interface module is substantially flush with an upper surface of the signal processing LSI.

6. The LSI package according to claim 1, wherein a diameter of the first through hole is different from that of the second through hole.

7. The LSI package according to claim 1, wherein the transmission line is extended from a side surface of the driving element unit substantially in parallel with the wiring board.

8. The LSI package according to claim 1, wherein the first electrical connection terminal is electrically connected to the second electrical connection terminal with the first electrical connection terminal being mechanically in contact with the second electrical connection terminal.

9. A mounting method of the LSI package with the interface module according to claim 1, comprising:
   determining the relative positions of the interface module and the interposer in the in-plane direction in a state in which the tapered portion of the movable guide pin is pressed to an opening edge of the first reference hole;
   sliding the movable guide pin to adjust a space between the interface module and the interposer with the movable guide pin being preliminarily fixed; and
   electrically connecting the first electrical connection terminal to the second electrical connection terminal.

10. An interface module on which a signal processing LSI is mounted and which is to be mounted on an interposer having a plurality of reference holes for positioning, comprising:
   a wiring board;
   a driving element unit provided on a surface of the wiring board which faces the interface module;
   a transmission line which transmits and receives a signal to and from the driving element unit;
   an electrical connection terminal formed on the surface and electrically connected to the driving element unit; and
   a plurality of movable guide pins each having a cylinder portion and a tapered portion connected to the cylinder portion, the diameter of the cylinder portion being larger than a reference hole provided in the interposer, a diameter of an end portion of the tapered portion which faces the interposer being smaller than that of the reference hole, the plurality of movable guide pins being movable in a direction in which the movable guide pins face the interposer and being provided on the wiring board in a preliminarily fixed state,
   wherein the tapered portions of the movable guide pins are pressed to opening edges of the reference holes of the interposer, whereby the relative position of the interface module is determined with respect to the interposer in the in-plane direction.

11. The interface module according to claim 10, wherein each of the movable guide pins has a stop portion having a diameter discontinuously enlarged between the cylinder portion and the tapered portion.

12. The interface module according to claim 10, wherein the transmission line is extended from a side surface of the driving element unit substantially in parallel with the wiring board.

13. An LSI package with an interface module comprising:
an interface module having a first surface and a second surface and including a wiring board having a first through hole, a driving element unit selectively provided on the second surface, a transmission line connected to the driving element unit and configured to transmit and receive a signal, and a first electrical connection terminal formed on the second surface and electrically connected to the driving element unit;
an interposer having a third surface facing the second surface and a fourth surface opposite to the third surface, and including a signal processing LSI mounted on the third surface, a second electrical connection terminal provided on the third surface, a mounting board connecting terminal provided on the fourth surface and a second through hole, the interposer being arranged so that the first through hole matches with the second through hole;
a stational guide pin provided on one of the interface module and the interposer so that the stational guide pin matches with a third through hole provided in the other of the interface module and the interposer; and
a movable guide pin inserted into the first through hole and the second through hole so that the first electrical connection terminal is connected to the second electrical connection terminal, to position the interface module and the interposer.

14. The LSI package according to claim 13, wherein a diameter of the stational guide pin is smaller than that of the third through hole.

15. The LSI package according to claim 13, wherein a length of the stational guide pin is larger than that of the movable guide pin.

16. The LSI package according to claim 13, further comprising at least two or more pairs of the movable guide pin and at least two or more pairs of the second through hole.

17. The LSI package according to claim 13, wherein the movable guide pin has a cylinder portion and a tapered portion connected to the cylinder portion, the diameter of the cylinder portion being larger than the second through hole provided in the interposer, a diameter of an end portion of the tapered portion which faces the interposer being smaller than that of the second through hole, the plurality of movable guide pins being movable in a direction in which the movable guide pins face the interposer and being provided on the wiring board in a preliminarily fixed state.

18. The LSI package according to claim 13, wherein the interface module includes an opening having a size larger than the signal processing LSI in a position facing the signal processing LSI, and the first surface of the interface module is substantially flush with the upper surface of the signal processing LSI.

19. The LSI package according to claim 17, wherein the movable guide pin has a stop portion having a diameter discontinuously enlarged between the cylinder portion and the tapered portion.

* * * * *